United States Patent
Brown et al.

(10) Patent No.: US 7,687,759 B2
(45) Date of Patent: Mar. 30, 2010

(54) SLOTTED MICROCHANNEL PLATE (MCP)

(75) Inventors: Benjamin Ryan Brown, Glade Hill, VA (US); Arlynn Walter Smith, Blue Ridge, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 11/945,495

(22) Filed: Nov. 27, 2007

(65) Prior Publication Data

US 2009/0134312 A1    May 28, 2009

(51) Int. Cl.
*H01J 31/50*    (2006.01)
*H01J 40/14*    (2006.01)

(52) U.S. Cl. .................. 250/214 VT; 250/207
(58) Field of Classification Search .............. 250/207, 250/214 VT, 214 LA; 313/103 CM, 103 R, 313/105 CM, 105 R, 524, 526
See application file for complete search history.

(56) References Cited

U.S. PATENT DOCUMENTS

| | | | | |
|---|---|---|---|---|
| 4,005,323 A | * | 1/1977 | Yates et al. | 313/105 CM |
| 4,070,578 A | * | 1/1978 | Timothy et al. | 250/336.1 |
| 4,912,314 A | * | 3/1990 | Sink | 250/207 |
| 5,263,075 A | * | 11/1993 | McGann et al. | 378/147 |
| 5,493,111 A | * | 2/1996 | Wheeler et al. | 250/207 |
| 5,686,721 A | * | 11/1997 | Schmidt-Bocking | 250/214 VT |
| 5,997,713 A | * | 12/1999 | Beetz et al. | 205/124 |
| 6,876,802 B2 | | 4/2005 | Rosine et al. | |
| 7,126,263 B2 | | 10/2006 | Peck | |
| 7,199,345 B1 | * | 4/2007 | Meisel et al. | 250/207 |
| 2003/0066951 A1 | * | 4/2003 | Benz et al. | 250/214 VT |

* cited by examiner

*Primary Examiner*—Georgia Y Epps
*Assistant Examiner*—Jennifer Bennett
(74) *Attorney, Agent, or Firm*—RatnerPrestia

(57) ABSTRACT

A microchannel plate (MCP) for an image intensifier includes an active portion having an input surface area for receiving electrons and an output surface area for outputting multiplied electrons. The input and output surface areas are oriented horizontally with respect to each other and spaced by a vertical distance. A non-active portion surrounds the active portion of the MCP. The non-active portion includes at least one slot extending vertically into the non-active portion and extending horizontally to form a horizontal slotted area. When the MCP is positioned vertically above an electron sensing device having wires looping vertically above the electron sensing device, the slot is configured to receive a portion of the wires, resulting in a vertical clearance between the MCP and the electron sensing device. The wires loop a vertical looping distance above a surface of the electron sensing device, and a portion of the vertical looping distance is configured to be received within the slot of the MCP. The horizontal slotted area may be a rectangle, and the input and output surface areas may also be rectangles.

14 Claims, 4 Drawing Sheets

SLOTTED MICROCHANNEL PLATE (MCP)

FIELD OF THE INVENTION

The present invention relates, in general, to image intensifier tubes and, more specifically, to an electron gain device, such as a microchannel plate (MCP), configured for close contact to an electron sensing device, such as a CMOS imager.

BACKGROUND OF THE INVENTION

Image intensifying devices can use solid state sensors, such as CMOS or CCD devices. Image intensifier devices amplify low intensity light or convert non-visible light into regularly viewable images. Image intensifier devices are particularly useful for providing images from infra-red light and have many industrial and military applications. For example, image intensifier tubes may be used for enhancing the night vision of aviators, for photographing astronomical events and for providing night vision to sufferers of night blindness.

There are three types of image intensifying devices: image intensifier tubes for cameras, solid state CMOS (complementary metal oxide semiconductor) and CCD (charge coupled device) sensors, and hybrid EBCCD/CMOS (electronic bombarded CCD or CMOS) sensors.

Referring to FIG. 1, there is shown a schematic diagram of an image intensifier tube, generally designated as 10. As shown, light energy 14 reflected from object 12 impinges upon photocathode 16. Photocathode 16 receives the incident energy on input surface 16a and outputs the energy, as emitted electrons, on output surface 16b. The output electrons, designated as 20, from photocathode 16, are provided as an input to an electron gain device, such as MCP 18. The MCP includes input surface 18a and output surface 18b. As electrons bombard input surface 18a, secondary electrons are generated within micro-channels 22 of MCP 18. The MCP generates several hundred electrons for each electron entering input surface 18a.

Although not shown, it will be understood that MCP 18 is subjected to a difference in voltage potential between input surface 18a and output surface 18b, typically over a thousand volts. This potential difference enables electron multiplication. Electrons 24, outputted from MCP 18, impinge upon solid state electron sensing device 26. Electron sensing device 26 may be a CMOS imager, for example, and includes input surface 26a and output surface 26b, as shown in FIG. 1. Electron sensing device 26 may be fabricated as an integrated circuit, using CMOS processes.

In general, the CMOS imager employs electron sensing elements. Input surface 26a includes an active receive area sensitive to the received electrons from MCP 18. The output signals of the electron sensing elements may be provided, at output surface 26b, as signals whose magnitudes are proportional to the amount of electrons received by the electron sensing elements. The number of electrons is proportional to incoming photons at the cathode. CMOS imagers use less power and have lower fabrication cost compared to imagers made by CCD processes.

The output of CMOS imager 26 produces an intensified image signal that may be sent, by way of a bus, to image display device 28. The output of CMOS imager 26 may be, alternatively, stored in a memory device (not shown).

To facilitate the multiplication of electrons between the input of the image intensifier tube, at input surface 16a, and the output of the image intensifier tube, at output surface 26b, a vacuum housing is provided. As shown, photocathode 16, MCP 18 (or other electron gain device) and CMOS imager 26 (or other electron sensing device) are packaged in vacuum housing 29. In addition to providing a vacuum housing, input surface 26a of the CMOS imager and output surface 18b of the MCP are required to physically be very closely spaced from each other.

Such close spacing presents a problem, because a conventional silicon die of a CMOS imager, for example, includes wires looping above the input surface of the imager for outputting the intensified image signal. Because these wires flare out from the silicon die and loop above the input surface, before they are connected to bond pads on a ceramic carrier holding the silicon die, it is difficult to closely space the input surface of the imager to the output surface of the MCP.

As an example, a conventional silicon die is shown in FIGS. 2a and 2b. As shown, chip 30 includes silicon die 32 attached to ceramic carrier 34. The silicon die includes an array of terminal pads 36 for providing input/output (I/O) signals. Hundreds of terminal pads 36 are typically disposed around the peripheral circumference of silicon die 32. Also shown in FIGS. 2a and 2b is an array of pads 38 disposed on ceramic carrier 34. Leads or wires 40 are attached by ultrasonic bonding of wires between I/O pads 36 and I/O pads 38, thereby making electrical contact between them. Extending from the bottom of ceramic carrier 34 are a plurality of pins 42, as shown in FIG. 2b, which are connected through via-holes (not shown) to the array of bond pads 38. In this manner, electrical contacts are made between bond pads 36 on silicon die 32 and the input/output of the chip, at the plurality of pins 42.

In a typical conventional configuration, wires 40 loop above the planar top surface of silicon die 32 and then descend down toward ceramic carrier 34, as shown in FIG. 2b. These wire loops above silicon die 32, in the case of a conventional CMOS imager (for example), prevent a tight vertical placement between the top active surface area of silicon die 32 and the output surface area of electron gain device 18. As best shown in FIG. 2c, output surface 18b of electron gain device 18 is placed in close vertical proximity to the input surface area of silicon die 32. However, because of the looping of wires 40, it is not possible to reduce the vertical space between output surface 18b and the top surface of silicon die 32. The lowest wire bond profile is limited to the wire bond height plus a vertical clearance to assure the wires do not contact the silicon surface and become shorted. The vertical clearance is also limited to the bondwire loop height plus a distance required to provide a voltage standoff between the output surface of the electron gain device and the input surface of the electron sensing device.

The present invention addresses this shortcoming by providing an electron gain device having rectangularly shaped slots, which allow for a tight interface and clearance between the electron sensing device and the electron gain device (for example an MCP).

SUMMARY OF THE INVENTION

To meet this and other needs, and in view of its purposes, the present invention provides a microchannel plate (MCP) for an image intensifier including an active portion having an input surface area for receiving electrons and an output surface area for outputting multiplied electrons. The input and output surface areas are oriented horizontally with respect to each other and spaced by a vertical distance. A non-active portion surrounds the active portion, where the non-active portion includes at least one slot extending vertically into the non-active portion and extending horizontally to form a horizontal slotted area. When the MCP is positioned vertically above an electron sensing device having wires looping vertically above the electron sensing device, the slot is configured to receive a portion of the wires, resulting in a vertical clearance between the MCP and the electron sensing device. The wires loop a vertical looping distance above a surface of the electron sensing device, and a portion of the vertical looping distance is configured to be received within the slot. The horizontal slotted area is a rectangle, and the input and output surface areas are rectangles. The non-active portion may include two slots, and the two slots form two horizontal slotted areas, one on one side of the output surface area and the other on the other side of the output surface area.

Another embodiment of the present invention includes a method for making an MCP for an image intensifier. The method includes the steps of: forming an active area by stacking fiber optic channels having acid etchable core rods and acid resistant cladding glass surrounding the etchable core rods; and forming a non-active area. The non-active area is formed by (a) stacking fiber optic channels having acid resistant core rods and acid resistant cladding glass surrounding the resistant core rods in a first region, and (b) stacking fiber optic channels having acid etchable core rods and acid etchable cladding glass surrounding the etchable core rods in a second region. Also included is a step of etching the active area and the non-active area to form (a) micro-channels in the active area for multiplying electrons, and (b) at least one slot in the second region. The one slot is configured to be placed above bondwires of an electron sensing device to receive the bondwires and provide a close spacing between the MCP and the electron sensing device.

Etching the non-active area includes forming two slots in the second region, and the two slots are configured to be placed above the bondwires of the electron sensing device to receive the bondwires and provide a close spacing between the active area of the MCP and the electron sensing device.

Forming the active area includes stacking the fiber optic channels having acid etchable core rods and acid resistant cladding glass surrounding the etchable core rods into a first rectangular shape. Forming the non-active area includes stacking the fiber optic channels having acid etchable core rods and acid etchable cladding glass surrounding the etchable core rods into two second rectangular shapes. Etching the active area includes forming a rectangular active area for multiplying electrons. Etching the non-active area includes forming two rectangular slots, one on one side of the rectangular active area and one on the other side of the rectangular active area.

Yet another embodiment of the present invention is an image intensifier including a ceramic substrate, an electron sensing device disposed vertically above the ceramic substrate, and bondwires looping between the ceramic substrate and the electron sensing device, where the bondwires loop vertically above the electron sensing device. An MCP is positioned vertically above the electron sensing device. The MCP includes at least one slot disposed at an output side of the MCP and vertically above the bondwires for nestling the bondwires and providing a close separation between the electron sensing device and the MCP. The MCP may include two slots. One slot nestles the bondwires on one side of the electron sensing device and another slot nestles the bondwires on another side of the electron sensing device.

BRIEF DESCRIPTION OF THE FIGURES

The invention may be understood from the following detailed description when read in connection with the following figures:

FIG. 2b is a sectional view of the electron sensing device shown in FIG. 2a.

DETAILED DESCRIPTION OF THE INVENTION

Figure 3A:
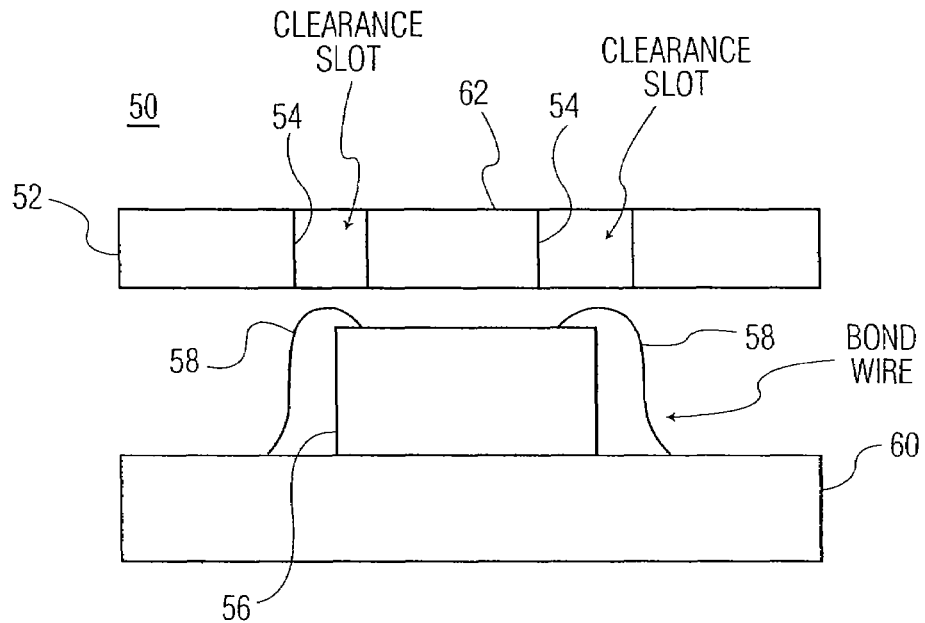
FIG. 3a is a sectional view of an electron sensing device spaced below and in close vertical proximity to an electron gain device, in accordance with an embodiment of the invention.
Figure 3B:
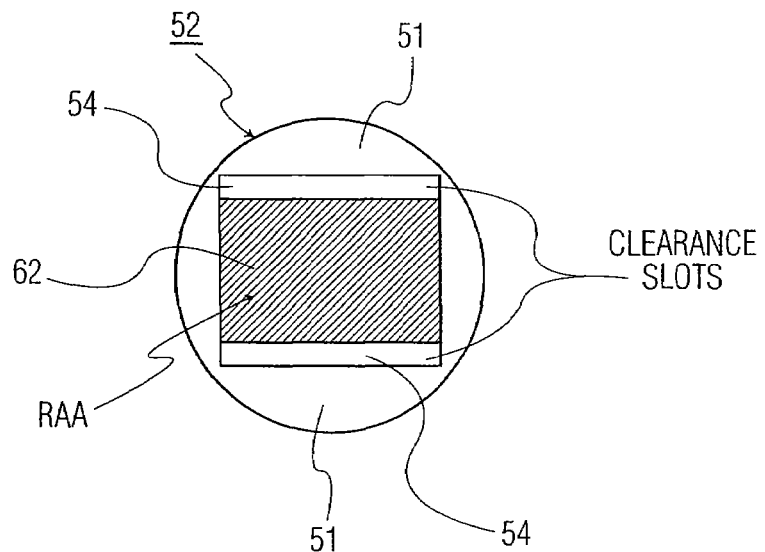
FIG. 3b is a top view of the electron gain device shown in FIG. 3a, in accordance with an embodiment of the invention.

Referring now to FIGS. 3a and 3b, there is shown an exemplary image intensifier, generally designated as 50. Image intensifier 50 includes an electron gain device, designated as 52, for example a microchannel plate (MCP). Image intensifier 50 also includes an electron sensing device, designated as 56, disposed on top of ceramic substrate 60. Electron sensing device 56 may include, for example, a solid state CMOS (complimentary metal oxide semiconductor) sensor, a CCD (charge couple device) sensor, or a hybrid electron bombarded CCD or CMOS sensor.

Figure 1:
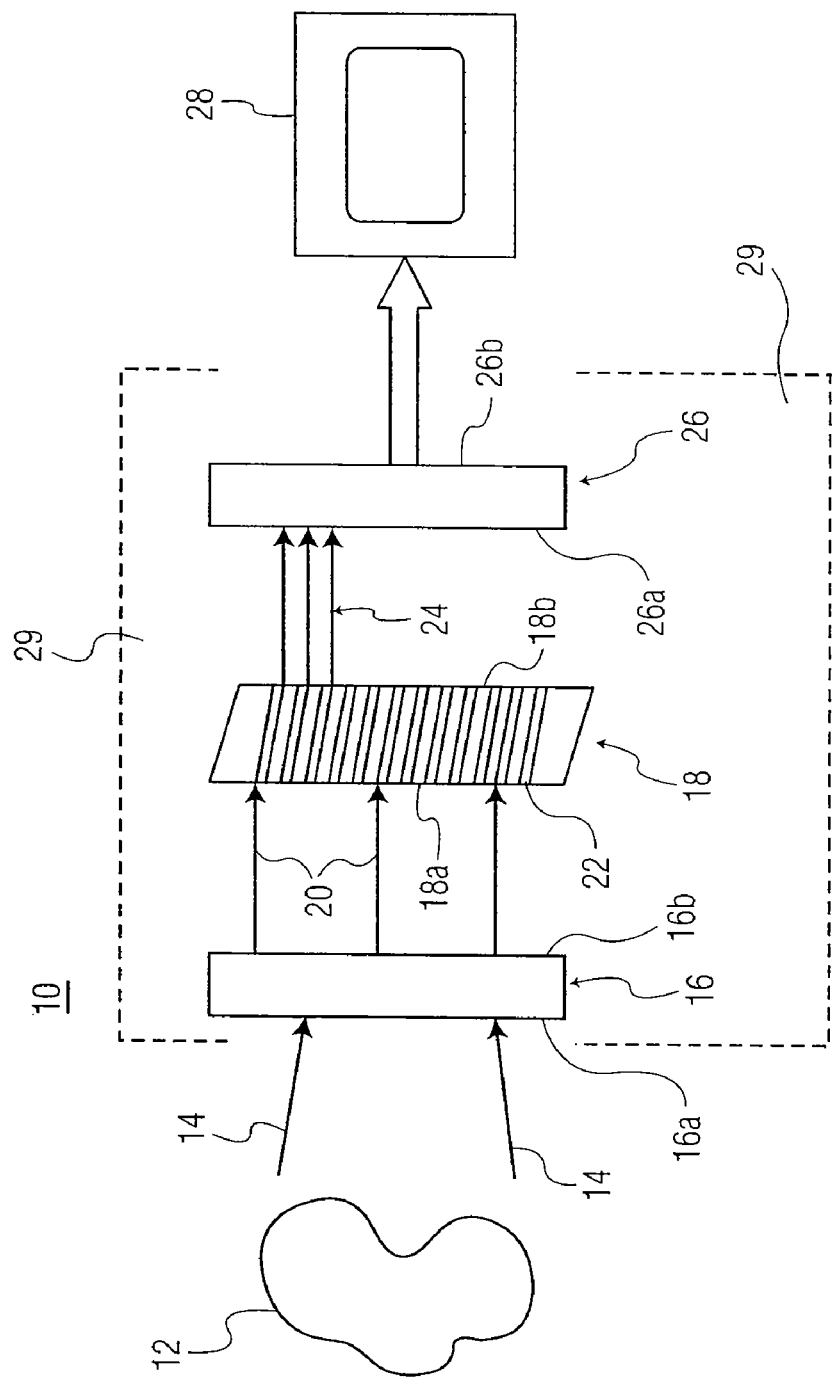
FIG. 1 is a schematic illustration of a typical image intensifier tube, including an electron gain device and an electron sensing device.
Figure 2A:
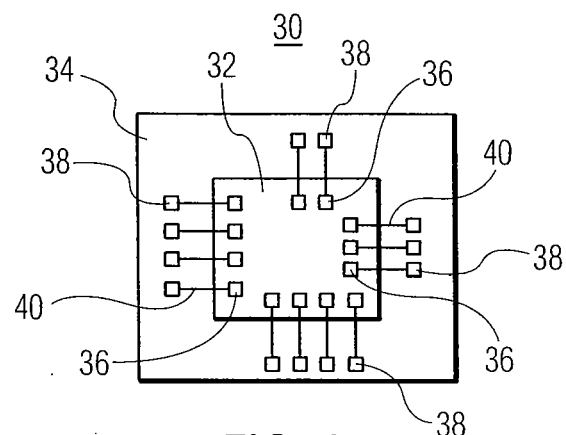
FIG. 2a is a top view of an electron sensing device formed in a conventional manner, showing a ceramic header and bondwires.
Figure 2B:
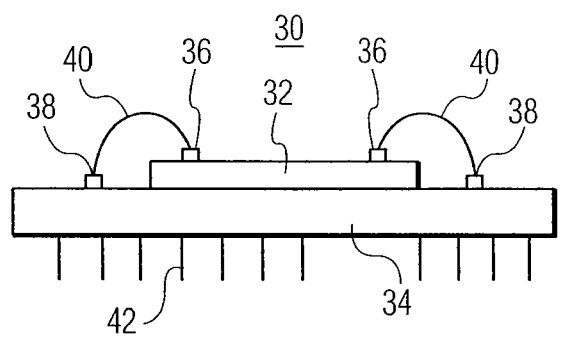
Figure 2C:
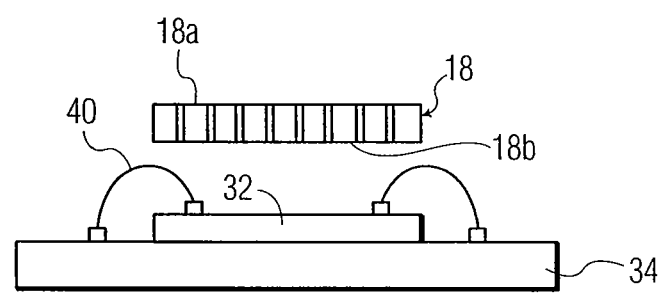
FIG. 2c is a sectional view of a conventional electron sensing device, spaced in vertical proximity to and below an electron gain device, when integrated together in an image intensifier tube.

As shown, electron gain device 52 is disposed above electron sensing device 56. The electron gain device includes an active region, generally designated as 62 ( also referred to as a rectangular active area (RAA 62)). It will be appreciated that the top surface of active region 62 includes an active receiving area sensitive to received electrons from a photocathode (shown as 16 in FIG. 1), the latter disposed vertically above electron gain device 52. Electron gain device 52 receives incident energy on its input surface and outputs amplified energy, as emitted electrons, on its output surface. The output electrons are provided as an input to electron sensing device 56. For example, electron gain device 52, such as an MCP, generates several hundred electrons for each electron entering at the input surface.

As shown, active region 62 is disposed vertically above electron sensing device 56. The electron sensing device receives the output electrons from electron gain device 52 and provides an output signal that is proportional to the amount of electrons received by the electron sensing device. Electron sensing device 56 includes wires 58 looping above the planar top surface of electron sensing device 56 and then descending down to ceramic substrate 60 for bonding.

In accordance with an embodiment of the present invention, electron gain device 52 includes slots on opposing vertical sides of active region 62, the slots generally designated as 54. Each slot is configured to receive a portion of wires 58 with a gap of 2-6 mils (50-150 microns) in width. As shown, slots 54 provide clearances for wires 58 at the sides of active region 62. It will be appreciated, of course, that if an electron sensing device includes looping wires on one side of the device only, then the slot on the opposing side of the electron gain device may be omitted.

Since the slots are configured to receive the wire loops above the planar top surface of electron sensing device 56, electron gain device 52 may be brought into close proximity to the electron sensing device. Since slots 54 provide additional clearance for bond wires 58, a smaller distance between electron gain device 52 and electron sensing device 56 may be realized. The smaller separation distance results in performance benefits.

As an example, without slots 54 providing clearances for the wire loops, then a minimum separation distance of 0.005 inches is required between the electron gain device and the electron sensing device. With the slots included for providing clearances for the wire loops, however, a minimum separation distance of approximately 0.002 inches may be realized.

It will be appreciated that a minimum distance may be maintained between bond wires 58 and the walls of slots 54 of electron gain device 52. This minimum distance may be determined by the voltage standoff needed to hold off any high voltages that are applied between the electron gain device and bond wires 58.

Although FIG. 3a depicts clearance slots 54 as spanning vertically from the input side to the output side of electron gain device 52, nevertheless, the vertical clearance is only required with respect to the bottom side of electron gain device 52 and the looping wires of electron sensing device 62. Thus, the clearance slots need not span the entire distance between the input output surfaces of electron gain device 52.

In another embodiment of the present invention, it may be desirable to provide physical contact between the output surface of the electron gain device and the input surface of the electron sensing device. In this embodiment, the gap width of clearance slots 54 may be such that the loops of bond wires 58 may be received entirely within the clearance slots. If direct physical contact between the electron gain device and the electron sensing device is made, such direct physical contact may mitigate any vibration concerns due to the electron sensing device bracing the electron gain device.

Figure 4:
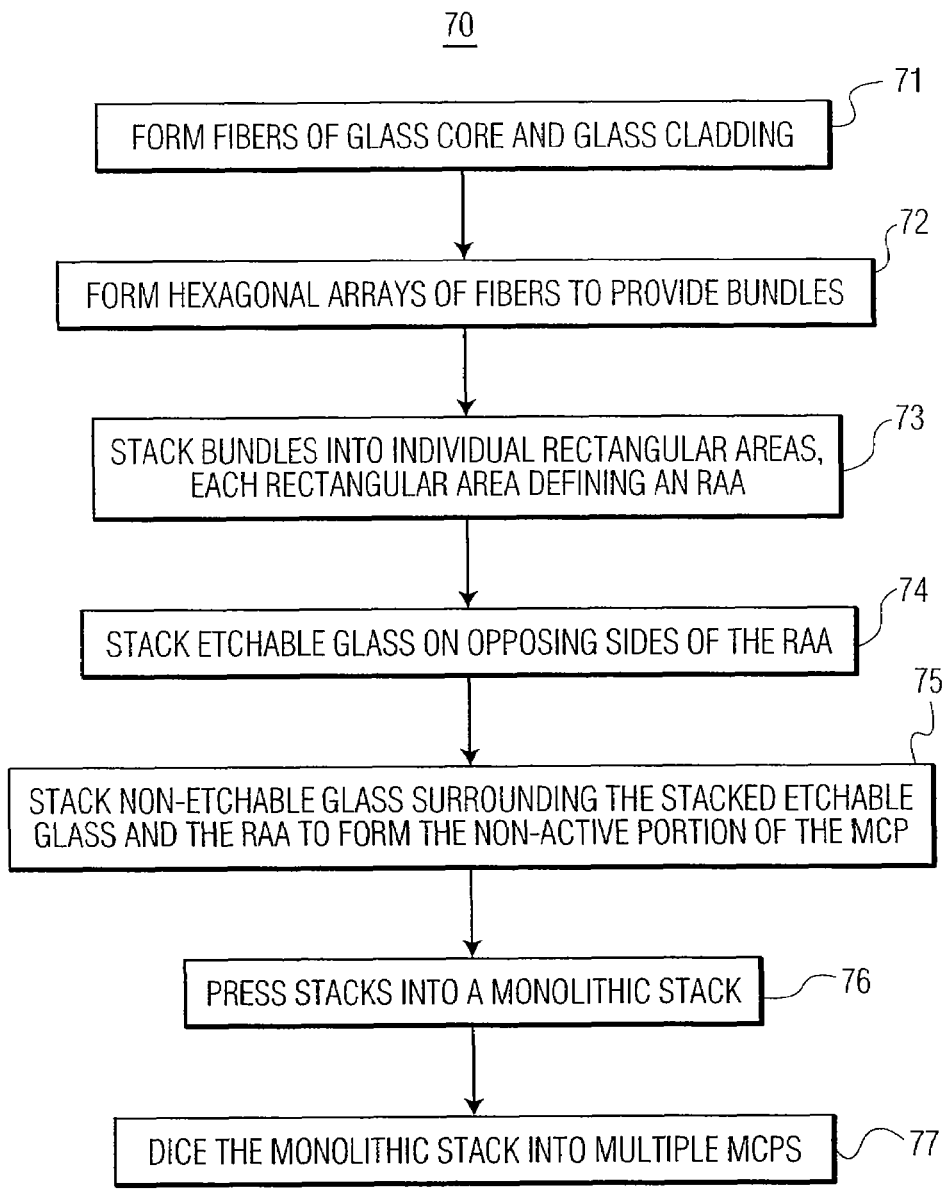
FIG. 4 is a flow diagram of a method for forming a clearance slot in an MCP, in accordance with an embodiment of the present invention.

Referring next to FIG. 4, there is shown method 70 for forming clearance slots in an MCP (for example), the method designated generally as 70. As shown, step 71 forms fibers of glass core surrounded by glass cladding. The glass core is made of material that is etchable, so that the core may be subsequently removed by etching. The glass cladding is made of glass that is non-etchable under the same conditions that allow etching of the core. Thus, each cladding remains after the etching process, and the cladding material becomes a boundary for each micro-channel that forms upon removal of a corresponding core. A suitable cladding glass is a lead-type glass, such as corning glass 8161.

As described in U.S. Pat. No. 7,126,263, issued on Oct. 24, 2006, which is incorporated herein by reference in its entirety, the optical fibers are formed in a draw machine which incorporates a zone furnace. The temperature of the furnace is elevated to the softening temperature of the glass. The fiber is fed into a traction mechanism, where the speed is adjusted until a desired fiber diameter is achieved. These individual fibers are then cut into shorter lengths of approximately 18 inches.

Method 70 then enters step 72 and forms multiple hexagonal arrays of fibers, each referred to as a bundle or a multi-assembly. A bundle is formed from several thousands of the cut links of single fibers, which are stacked into a mold and heated at the softening temperature of the glass, where each of the cut lengths has a hexagonal configuration.

The bundle is again suspended in a draw machine and drawn to again decrease the fiber diameter, while still maintaining the hexagonal configuration of the individual fibers. The bundle is then cut into shorter lengths of approximately 6 inches. Several hundred of the cut bundles are then stacked, in step 73, to form individual rectangular cross-sectional areas (for example), where each cross-sectional area defines a rectangular active area (RAA). One RAA, for example, is shown in FIG. 3b designated as 62.

Next, method 70 enters step 74 to stack completely etchable glass (also referred to as rods) on opposing sides of the RAA. As an example, the stacked etchable glass forms the rectangular regions which later will form the clearance slots designated as 54 in FIG. 3b.

Next, step 75 stacks non-etchable glass to surround both the stacked etchable glass and RAA region 62. The non-etchable glass forms region 51 of electron gain device 52 in FIG. 3b. Accordingly, RAA region 62 forms the active area of MCP 52, regions 54 form the clearance slots on opposing sides of RAA region 62, and region 51 forms the non-active portion of the MCP.

Step 76 presses the stacks into a monolithic stack. Next, step 77 dices the monolithic stack into multiple MCPs.

During a standard etching process, the etchable multi fibers are completely etched away leaving open slots to accommodate the looping wires. The etchable glass cores in the RAA region form the micro-channels. The non-etchable glass surrounding the clearance slots and the RAA region forms the non-active area of the MCP and provides support for mounting the MCP within the image intensifier tube.

The present invention may be used for any application that requires a close proximity between two devices, where physical clearance between the two devices is an issue. The physical clearance issue does not necessarily have to result from bond wires looping above a top surface of a device, but may result from any physical body protruding above another body.

Another application for the present invention may be in using the slotted apertures for venting purposes during processing of the MCP. Presently in film-less MCP based image intensifier tubes, vent holes are drilled into the metal tube body components to provide venting of gases during processing. The clearance slots of the present invention may eliminate any need for vent holes in the metal tube body, if the vents are located within the MCP itself.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A microchannel plate (MCP) for an image intensifier comprising an active portion having an input surface area for receiving electrons and an output surface area for outputting multiplied electrons, the input and output surface areas oriented horizontally with respect to each other and spaced by a vertical distance, and a non-active portion formed from glass surrounding the active portion, the non-active portion including at least one slot extending vertically into the non-active portion and extending horizontally to form a horizontal slotted area corresponding to a surface area of etchable glass, wherein when the MCP is positioned vertically above an electron sensing device having wires looping vertically above the electron sensing device, the slot is configured to receive a portion of the wires, resulting in a vertical clearance between the MCP and the electron sensing device, the at least one slot extends vertically into the non-active portion of the MCP, and terminates at the surface area of etchable glass, the active portion includes stacked fiber optic channels having acid etchable core rods and acid resistant cladding glass surrounding the core rods, and the non-active portion includes stacked acid etchable fiber optic channels having acid etchable core rods and acid etchable cladding glass surrounding the core rods, and the slot is formed by etching away the acid etchable fiber optic channels.

2. The MCP of claim 1 wherein
the wires loop a vertical looping distance above a surface of the electron sensing device, and
a portion of the vertical looping distance is configured to be received within the slot.

3. The MCP of claim 2 wherein
the MCP is positioned vertically above the electron sensing device, resulting in the vertical clearance of an amount equal to or greater than a remaining portion of the vertical looping distance.

4. The MCP of claim 1 wherein
the wires loop a vertical looping distance above a surface of the electron sensing device, and
the vertical looping distance is configured to be received within the slot, and
the MCP is positioned vertically above the electron sensing device, resulting in the vertical clearance of an amount substantially close to zero.

5. The MCP of claim 4 wherein
the vertical clearance is approximately 0.002 inches.

6. The MCP of claim 1 wherein
the slot extends vertically into the non-active portion by an amount between 50 and 150 microns.

7. The MCP of claim 1 wherein
the horizontal slotted area is a rectangle, and the input and output surface areas are rectangles.

8. The MCP of claim 7 wherein
the non-active portion includes two slots, and
the two slots form two horizontal slotted areas, one on one side of the output surface area and the other on the other side of the output surface area.

9. The MCP of claim 1 wherein
the electron sensing device is disposed vertically above a ceramic substrate, and
the wires loop between the electron sensing device and the ceramic substrate, and
two slots are configured to receive the wires looping vertically above the electron sensing device.

10. An image intensifier comprising
a ceramic substrate,
an electron sensing device disposed vertically above the ceramic substrate,
bondwires looping between the ceramic substrate and the electron sensing device, the bondwires looping vertically above the electron sensing device, and
an MCP formed of glass positioned vertically above the electron sensing device,
wherein the MCP includes at least one slot disposed at an output side of the MCP and vertically above the bondwires for nestling the bondwires and providing a close separation between the electron sensing device and the MCP, and
the at least one slot is formed by etching the glass of the MCP,
wherein the at least one slot includes vertical and horizontal planes, the vertical plane is oriented parallel to multiple channels of the MCP, and the horizontal plane is oriented parallel to a horizontal surface area comprised of etchable glass of the MCP, and
the slot is formed from bundled fiber optic channels, including glass material that is completely etchable.

11. The image intensifier of claim 10 wherein
the MCP includes two slots,
one slot for nestling the bondwires on one side of the electron sensing device and another slot for nestling the bondwires on another side of the electron sensing device.

12. The image intensifier of claim 10 wherein
the close separation includes a gap between the electron sensing device and the MCP smaller than 0.005.

13. The image intensifier of claim 10 wherein
the electron sensing device includes a CMOS imager.

14. A microchannel plate (MCP) for an image intensifier comprising
an active portion having an input surface area for receiving electrons and an output surface area for outputting multiplied electrons,
the input and output surface areas oriented horizontally with respect to each other and spaced by a vertical distance, and
a non-active portion formed from glass surrounding the active portion,
the non-active portion including at least one slot extending vertically into the non-active portion and extending horizontally to form a horizontal slotted area,
wherein when the MCP is positioned vertically above an electron sensing device having wires looping vertically above the electron sensing device, the slot is configured to receive a portion of the wires, resulting in a vertical clearance between the MCP and the electron sensing device, and
the at least one slot is formed by etching an area of the glass in the non-active portion of the MCP, and
the active portion includes stacked fiber optic channels having acid etchable core rods and acid resistant cladding glass surrounding the core rods, and
the non-active portion includes stacked acid etchable fiber optic channels having acid etchable core rods and acid etchable cladding glass surrounding the core rods, and
the slot is formed by etching away the acid etchable fiber optic channels.

* * * * *